United States Patent
Ouchi et al.

(10) Patent No.: US 7,902,003 B2
(45) Date of Patent: Mar. 8, 2011

(54) SEMICONDUCTOR DEVICE AND METHOD FOR MANUFACTURING THE SAME

(75) Inventors: Kiyoshi Ouchi, Kodaira (JP); Mutsuko Hatano, Kokubunji (JP); Takeshi Sato, Kokubunji (JP); Mitsuharu Tai, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 867 days.

(21) Appl. No.: 11/620,154

(22) Filed: Jan. 5, 2007

(65) Prior Publication Data
US 2007/0155070 A1    Jul. 5, 2007

(30) Foreign Application Priority Data
Jan. 5, 2006    (JP) .................................. 2006-000618

(51) Int. Cl.
*H01L 21/84*    (2006.01)
(52) U.S. Cl. ................. 438/151; 439/149; 257/E29.147; 257/E29.295
(58) Field of Classification Search .................... 257/59, 257/72, 66, 69, 347; 438/149, 151
See application file for complete search history.

(56) References Cited

U.S. PATENT DOCUMENTS

| 5,731,613 A * | 3/1998 | Yamazaki et al. | 257/350 |
| 2003/0042542 A1 * | 3/2003 | Maegawa et al. | 257/347 |
| 2006/0001051 A1 * | 1/2006 | Tai et al. | 257/213 |
| 2007/0004112 A1 * | 1/2007 | Shen et al. | 438/197 |

FOREIGN PATENT DOCUMENTS

JP    2002-368009    * 12/2002

OTHER PUBLICATIONS 12.4L Late-News paper: Selectively Enlarging laser Crystallization; Technology for High and Uniform Performance Poly-Si TFTs; M. Hatano et al.

* cited by examiner

*Primary Examiner* — A. Sefer
(74) *Attorney, Agent, or Firm* — Antonelli, Terry, Stout & Kraus, LLP.

(57) ABSTRACT

An image display device capable of high-resolution and smooth moving image display, equipped with TFTs in an n-type (or p-type) semiconductor layer with a high on-off ratio and a low resistance. In polysilicon crystallization by laser annealing, an n-type (or p-type) semiconductor layer with a low resistance is produced by performing the following processes in order: implanting nitrogen (N) ions into an amorphous silicon precursor semiconductor film; laser crystallization; implanting n-type (or p-type) dopant ions; and annealing for dopant activation. When fabricating TFTs, this low-resistance semiconductor layer is used to form a source and a drain. Since C, N, and O impurities decrease the mobility of the TFTs, polysilicon is used in which the contaminants concentrations meet the following conditions: carbon concentration $\leq 3 \times 10^{19}$ cm$^{-3}$, nitrogen concentration $\leq 5 \times 10^{17}$ cm$^{-3}$, and oxygen concentration $\leq 3 \times 10^{19}$ cm$^{-3}$.

13 Claims, 10 Drawing Sheets

FIG. 5(a)
PCF
UDC
GLS
FIG. 5(b)
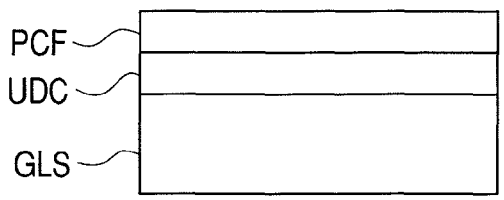
N IMPLANTATION
POI
PCF
UDC
GLS
FIG. 5(c)
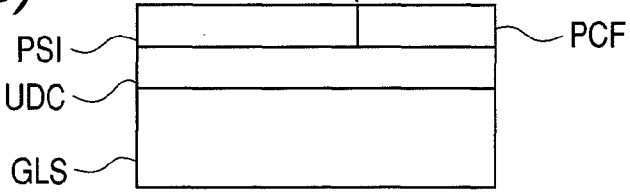
CW LASER ANNEALING   LASER SCAN DIRECTION
PSI
PCF
UDC
GLS
FIG. 5(d)
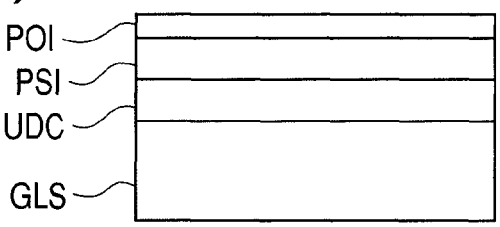
P IMPLANTATION
POI
PSI
UDC
GLS
FIG. 5(e)
PSI
UDC
GLS
DEPTH
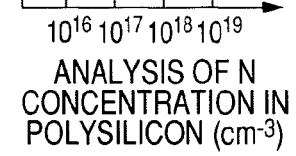
$10^{16}$ $10^{17}$ $10^{18}$ $10^{19}$
ANALYSIS OF N CONCENTRATION IN POLYSILICON (cm$^{-3}$)

SEMICONDUCTOR DEVICE AND METHOD FOR MANUFACTURING THE SAME

CLAIM OF PRIORITY

The present application claims priority from Japanese application JP 2006-000618 filed on Jan. 5, 2006, the content of which is hereby incorporated by reference into this application.

Field of the Invention

The present invention relates to a method for manufacturing an image display device using liquid crystal elements and organic light-emitting elements, particularly, an image display device incorporating drive circuits formed by low temperature polysilicon technology, and relates to an image display device produced by this manufacturing method.

BACKGROUND OF THE INVENTION

An image display device (hereinafter referred to as a display) using liquid crystal elements, namely, a liquid crystal display is widely used for a monitor of various kinds of information equipment such as television receivers and personal computers, owing to its features of a thin structure and low power consumption. Particularly, the liquid crystal display for late mobile appliances is required to achieve higher image quality and higher resolution as well as to have added values such as improved functionality, a thinner and lighter structure, and reduced manufacturing cost. Lately, there has been an increasing trend in the development of what is called a system-in-display that incorporates drivers (drive circuits) for driving timing controllers and pixels, wherein the drivers are constructed with thin-film transistors (hereinafter also referred to as TFTs) using a low temperature polysilicon film on a glass substrate that is the same as for the liquid crystal display.

TFTs are already used to drive pixels in the liquid crystal display. Heretofore, an amorphous silicon material with low carrier mobility (hereinafter simply referred to as mobility) has been used. It is desirable to use a silicon material with higher mobility, because the TFT for driving the driver circuits is required to have high driving ability.

The most bottleneck for this requirement is the use of a large glass substrate in display production. For this reason, the temperature of the TFT fabrication process is restricted by the allowable temperature limit of the glass. However, in recent years, a technology that enables polysilicon crystallization and TFT fabrication on the glass substrate with a low temperature process not higher than 600° C. has been put into practical use.

At the present, as a method for crystallizing polysilicon at a low temperature, an excimer laser annealing (ELA) process is a mainstream. The ELA process irradiates an amorphous silicon film with high-output excimer laser pulses, thereby melting and re-crystallizing a large area of silicon film. Since this ELA process does not control the crystal growing direction, the orientation of crystal grain boundaries is random and the grain size is small in the order of 0.2 to 0.8 µm. The thus formed crystal grains have a large surface roughness with the swelling grain boundaries.

Since these grain boundaries limit the current driving performance of the TFTs and the reliability of the elements, a technique of crystallizing polysilicon more like a single crystal is considered. As an example of such technique, a Selectively Enlarging Laser Crystallization (SELAX) process is disclosed in a compilation of papers submitted to the Society for Information Display 2002 International Symposium (Boston, 2002) PP158-161. This method is to move (scan) the laser radiation on the silicon film formed on the substrate (or the stage on which the substrate underlying the formed silicon film is loaded) in a certain direction with regard to the substrate surface, using continuous-wave (CW) laser or pseudo CW laser light with a extremely high pulse frequency of several tens of MHz or higher.

By this laser scanning, the crystal grows along the certain direction. The crystal grain boundaries are formed substantially in parallel with the crystal growing direction. Consequently, no swelling takes place at the grain boundaries and, therefore, a film with a planar surface is obtained. The crystal grains are grown in a zone which is about 0.2-0.8 µm wide and about 2-8 µm long. This formation of the crystal grains introduces anisotropy between electrical conductivity in the crystal growing direction and that in the direction perpendicular to the growing direction. That is, the electrical conductivity in the crystal growing direction produces higher mobility, because of a decrease in the density of the crystal grain boundaries across which carriers pass.

As the CW laser light, for example, a light obtained by converting a fixed laser wavelength of 1064 nm into 532 nm is used. The output of the CW laser light or the pseudo CW laser light is smaller than the pulse excimer laser. Therefore, the laser light must be shaped into a beam for efficient crystallization. That is, the shape of the beam irradiating the substrate should be a long and thin rectangle with its long axis perpendicular to the laser scan direction. This is intended to increase throughput by enlarging a region to be scanned at a time. The long side of this rectangle is, in most cases, not more than 100 µm, though depending on the laser output. Thus, crystallization by annealing using the CW laser is selectively applied only to peripheral circuit portions where high-performance TFTs are needed.

SUMMARY OF THE INVENTION

A problem that is common for crystallization methods by annealing including, but not limited to, the ELA process, CW laser annealing, or other methods is impurity incorporation. Particularly, carbon (C), nitrogen (N), and oxygen (O) impurities which are contamination sources exist in an undercoat layer (dielectric undercoat layer) and a precursor semiconductor film itself, and also in the atmosphere for crystallization. Therefore, the incorporation of these impurities is inevitable during the crystallization process.

To eliminate the impurities, a consistent process in vacuum is effective. However, it is difficult to apply the consistent process in vacuum to large substrates. The influence of these C, N, and O impurities on the crystal properties of polysilicon and the TFT performances has not been well explained heretofore. To investigate the influence of the C, N, and O impurities on the TFT performances, the present inventors conducted an experiment which will be described below.

On a 0.6-mm thick glass substrate, a 140-nm thick silicon nitride (SiN) film and a 100-nm thick silicon oxide (SiO) film are formed as the dielectric undercoat layer. Over the undercoat, as the precursor semiconductor film, a 50-nm thick amorphous silicon film was subsequently formed by a plasma chemical vapor deposition (CVD) process. After forming the precursor semiconductor film, hydrogen in the amorphous silicon was reduced by annealing at 400° C. After the formation of a SiO protective film, C, N, and O were implanted at concentrations from $1 \times 10^{18}$ cm$^{-3}$ to $2 \times 10^{20}$ cm$^{-3}$ to contaminate the amorphous silicon precursor semiconductor film on purpose. After the removal of the SiO protective film by etching, normal CW laser annealing crystallization and TFT fabrication process were performed. By forming the amorphous silicon film in an as-deposited state under the condition of making the concentrations of the impurities as low as possible, the influence of the implantation of the C, N, and O impurities was made easy to detect.

FIG. 1 represents relationships between the mobility as the result of TFT performance measured at a drain voltage of 0.1 V and the concentrations of the ion-implanted impurities. The concentrations of the C, N, and O impurities are plotted on the abscissa and the field effect mobility of TFT is plotted on the ordinate. A reference sample which is not implanted any impurity is marked with X. FIG. 1 shows a decrease in the mobility by contaminating the precursor semiconductor film with any of C, N, and O. Particularly, a significant decrease in the mobility occurs with the C contaminated sample and a decrease of 20% or more as compared with the reference sample was seen. To investigate a cause of this, mass analysis of the impurities in the crystallized polysilicon was carried out.

FIGS. 2A through 2D represent the profiles of the concentrations of the impurities (C, N, and O) in regard to a precursor semiconductor and its crystallized polysilicon. FIGS. 2A, 2B, 2C, and 2D show the impurity concentration profiles in a depth direction in the samples implanted with C, N, and O, respectively, by $1 \times 10^{20}$ cm$^{-3}$, and in the reference sample not implanted with any impurity before and after crystallization. The results shown in FIG. 2 are those obtained by CW laser crystallization.

Noting change in the C concentration in each sample, the C concentration increases in all samples. For the C-contaminated sample, implanted with C by $1 \times 10^{20}$ cm$^{-3}$, shown in FIG. 2A, the C concentration increased from $1 \times 10^{20}$ cm$^{-3}$ to $1.2 \times 10^{20}$ cm$^{-3}$. For the samples shown in FIGS. 2B, 2C, and 2D, the initial C concentration of $1 \times 10^{18}$ cm$^{-3}$ increased to $5 \times 10^{19}$ cm$^{-3}$. From these results, it was found that C in the crystallized polysilicon increases by the penetration of C contaminants existing on the surface when the amorphous silicon is melt by laser in addition to the C initially implanted into the amorphous silicon precursor semiconductor film. For the samples shown in FIGS. 2B, 2C, and 2D, without being contaminated with C on purpose, the C contamination in the laser annealed silicon is mainly due to the incursion of C from the surface, when melt in the crystallization process. Since the impurity concentration is high at the surface or interface, the representative concentrations of the samples are those taken at the lowest concentration portion in the film.

On the other hand, for the N and O impurities, a new finding was that an effect of expelling the impurities from inside the film is found along with the incursion of the surface contaminants in the process of melting and re-crystallization. Thus, the concentration profiles of these impurities in the depth direction indicate a tendency that the concentration inside the film is low and the concentration at the surface and interface is high. For the contaminated samples implanted with N and O, the N and O implanted into the respective samples are expelled and their concentrations decrease from the initial concentrations. For the samples not contaminated with N and O on purpose, the N and O concentrations increase due to the incursion of N and O during the crystallization process.

In the samples not implanted with N and O, the N and O concentrations were initially $1.5 \times 10^{17}$ cm$^{-3}$ and $1 \times 10^{1}$ cm$^{-3}$, respectively, and the concentrations increased to $2.5 \times 10^{17}$ cm$^{-3}$ and $8 \times 10^{18}$ cm$^{-3}$. These values do not significantly differ from the N and O concentrations taken after crystallization in the samples implanted with N and O. In the case of N and O, unlike C, the incursion of the surface contaminants and the constituent elements of the dielectric undercoat and the expelling thereof take place at the same time, resulting in the N and O concentrations in the film after crystallization falling in a given range. This is considered as the reason why the mobility decrease induced by N and O is smaller than that induced by C. This effect of expelling N and O is considered to take place because the solid solubility limits of N and O in silicon are low.

From this experiment, another important finding regarding the relationships between the electrical properties of polysilicon and the impurities was obtained. By implanting N into amorphous silicon which is the precursor semiconductor film, an n-type or p-type semiconductor layer with a low resistance is obtained. Generally, it is technically difficult to reduce the resistance of a thin layer of polysilicon used for TFTs. When phosphorus (P) or boron (B) ions are implanted at a high concentration in order to increase the carrier concentration, the crystal properties are deteriorated and, subsequently, do not recover by annealing.

When forming an n-type or p-type semiconductor layer in the normal TFT fabrication method, amorphous silicon is annealed by laser for silicon crystallization, then P or B ions are implanted into the source and drain regions, and activation annealing is performed. On the other hand, as a result of the experiment conducted by the inventors, it was found that a semiconductor film as a low resistance layer is produced by inserting a process of implanting N into the amorphous silicon before laser crystallization.

In the amorphous silicon sample implanted with N on purpose in the present experiment, N is accumulated at the interface with the dielectric undercoat as the result of crystallization, as shown in FIG. 2B. The thus accumulated N acts as a core for the recovery of the crystal properties damaged by P ion implantation and high mobility is obtained. In this relation, the probability that P works as a donor, namely, its activation ratio is almost the same as for the reference sample not implanted with N.

FIG. 3 represents relationships between the sheet resistance of the n-type semiconductor film and the amounts of C, N, and O implanted. While C and O do not contribute to decreasing the resistance, the sheet resistance of the sample implanted with N by $1 \times 10^{1}$ cm$^{-3}$ decreased up to 40% or more as compared with the reference sample. However, N should be implanted within an optimal range of N concentration; the resistance does not decrease at a high concentration of $1 \times 10^{20}$ cm$^{-3}$. This is attributed to an adverse effect of N that affects polysilicon crystallization by CW laser annealing. As noted by a decrease in the mobility shown in FIG. 1, this is due to that the crystal properties of polysilicon before dopant implantation are deteriorated. Because the effect of expelling N during crystallization by CW laser annealing is not sufficient, the N concentration in the polysilicon film is higher as compared with other samples and it is also conceivable that N as the impurity purely disturbs the crystal lattice.

As the condition of decreasing the resistance of the n-layer semiconductor film, it is important that N is accumulated at the interface between the polysilicon layer crystallized by CW laser annealing and the undercoat layer. In a case where N ions are implanted into the polysilicon layer crystallized by CW laser annealing, not the precursor semiconductor film, N evenly diffuses across in the film. In this case, the effect of decreasing the resistance can be found, but, to a small degree.

This is because N in this case also contributes to disturbing the crystal lattice as the impurity. In this relation, for N accumulation at the interface during crystallization by laser annealing, CW laser annealing is more effective than the ELA process. Only with the ELA process, the concentration profile does not show a steep peak which would appear in the profile in the case of CW laser annealing Polysilicon TFTs are mostly used for display application such as a liquid crystal panel and organic EL and are employed in pixel driving circuits and peripheral circuits. Particularly, in the liquid crystal panel, a higher speed of displaying an image is required and, therefore, a high on-off ratio is required for the TFTs for these circuits. As noted previously, because the impurity contamination level has a direct effect on the TFT performances, it becomes a factor that determines the performances of the circuits built in the periphery of the liquid crystal panel or the liquid crystal panel itself.

Therefore, an object of the present invention is to achieve an image display device capable of high-resolution and smooth moving image display, equipped with TFTs in an n-type (or p-type) semiconductor layer with a high on-off ratio and a low resistance, based on the findings on the impurities obtained from the above-described experiment.

After examining the influence of the C, N, and O impurities in polysilicon laser annealing and crystallization, the present inventors found the following three points:

(1) All the C, N, and O impurities incorporated into the precursor semiconductor film or during the crystallization process decrease the mobility of TFT.

(2) During the melting and re-crystallization process by laser annealing, incursion of the C, N, and O impurities and their expelling take place at the same time and, in the thus formed polysilicon film, the concentrations of the impurities show their characteristic profiles. That is, these profiles show that the effect of the C impurity incursion is great and the concentrations of the N and O impurities are high at the interface with the surface due to the effect of expelling the impurities.

(3) The N impurities accumulated at the interface between the polysilicon layer and the dielectric undercoat layer facilitate the recovery of the crystal properties during dopant activation annealing. Thereby, the semiconductor film with a high mobility and a low resistance is formed. As the laser annealing method, particularly, the use of the CW laser is an efficient method for N accumulation at the interface.

Accordingly, a first feature of the present invention to attain the above object is forming an n-type (or p-type) semiconductor film with a low resistance using polysilicon in which N impurities are accumulated at the interface with the dielectric undercoat layer and using the semiconductor film for TFT fabrication. If the N accumulation is regulated to take place only in a source region and a drain region, especially, the purpose of the high on-off ratio can be achieved effectively. The use of a lighty doped drain (LDD) structure is also effective. This semiconductor film may be used for applications in need of a low-resistance film, irrespective of TFTs.

A second feature of the present invention is limiting the concentrations of C, N, and O impurities to be used for TFT formation. It was found that the incursion of the C, N, and O impurities and their expelling take place during the laser annealing and crystallization process. There are a number of factors that influence the concentrations of the impurities in the polysilicon film, such as contaminants in the precursor semiconductor film, contaminants in the dielectric undercoat layer, atmosphere for crystallization, and laser annealing conditions for crystallization. It is difficult to define all these factors and, therefore, allowable concentrations of the impurities in the polysilicon film were set.

From FIGS. 1 and 2, desirable contamination levels which are equivalent to the levels in the reference sample are as follows: C concentration $\leq 2\times10^{19}$ cm$^{-3}$, N concentration $\leq 3\times10^{17}$ cm$^{-3}$, and O concentration $\leq 7\times10^{18}$ cm$^{-3}$. Through consideration of precursor semiconductor deposition conditions, however, C concentration $\leq 3\times10^{19}$ cm$^{-3}$, N concentration $\leq 5\times10^{17}$ cm$^{-3}$, and O concentration $\leq 3\times10^{19}$ cm$-3$ in the polysilicon film were selected as minimum requirements at a practical level. Note that these concentrations are defined in the lowest concentration portion of the polysilicon film.

According to the present invention, it becomes possible to achieve an n-type or p-type semiconductor layer with a low resistance. By using this low-resistance film to form the source region and drain region of a TFT, a high on-off ratio can be obtained. In consequence, an image display device capable of high-resolution and smooth moving image display can be achieved.

BRIEF DESCRIPTION OF THE DRAWINGS

FIGS. 5A through 5E show cross-sectional views of the substrate corresponding to the processes in FIG. 4;

DETAILED DESCRIPTION OF THE PREFERRED EMBODIMENTS

In the following, illustrative embodiments of the present invention will be described in detail with reference to the drawings.

First Embodiment

Figure 1:
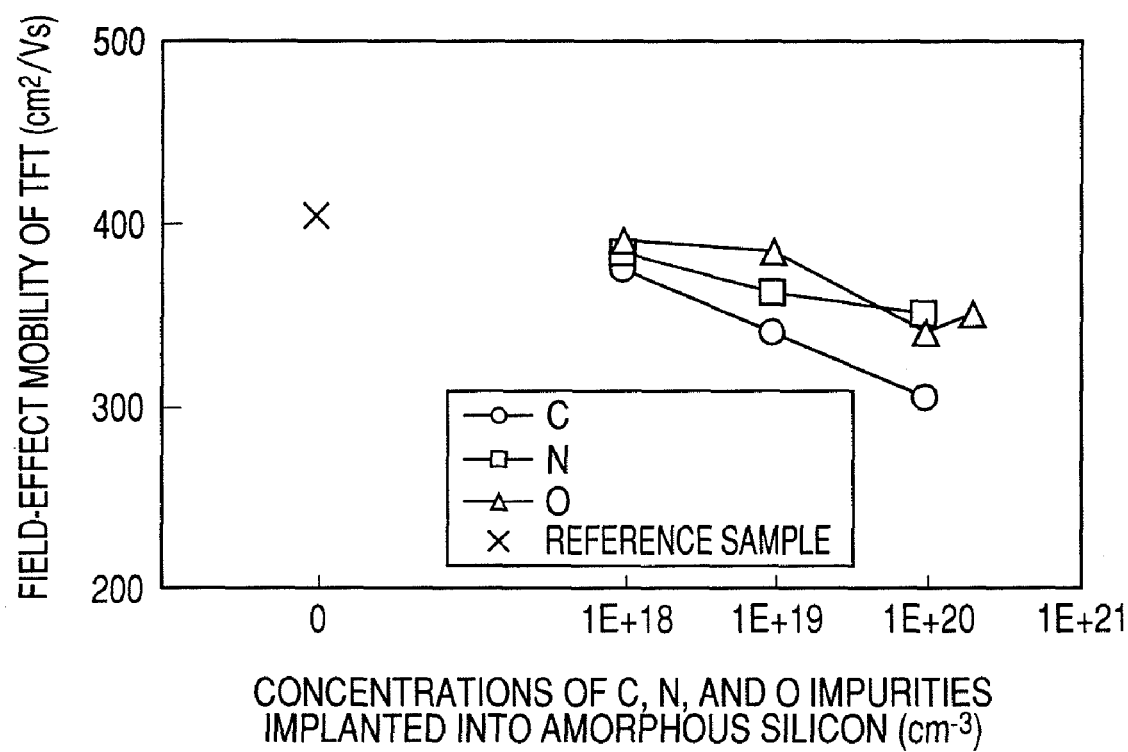
FIG. 1 represents relationships between the mobility as the result of TFT performance measured at a drain voltage of 0.1 V and the concentrations of the ion-implanted impurities (C, N, and O)
Figure 2A:
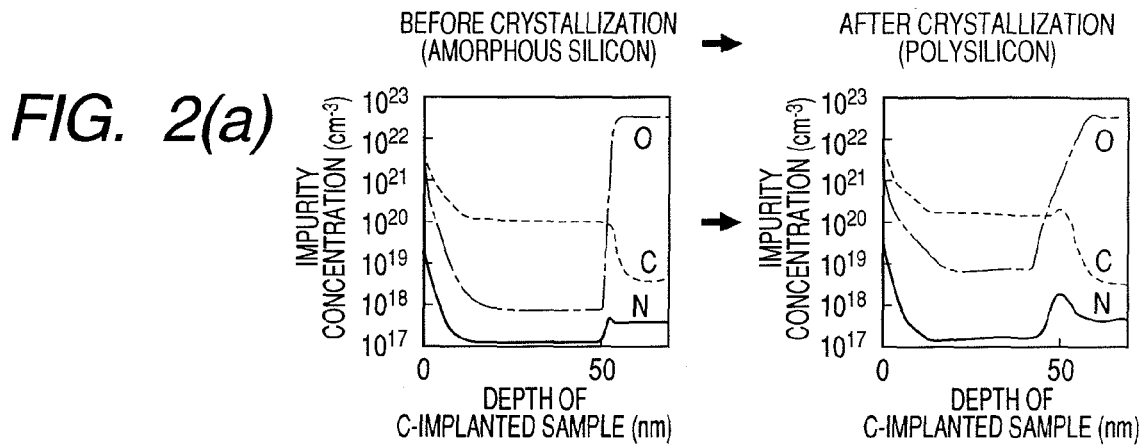
FIGS. 2A through 2D represent the profiles of the concentrations of the impurities (C, N, and O) in regard to a precursor semiconductor and its crystallized polysilicon.
Figure 2B:
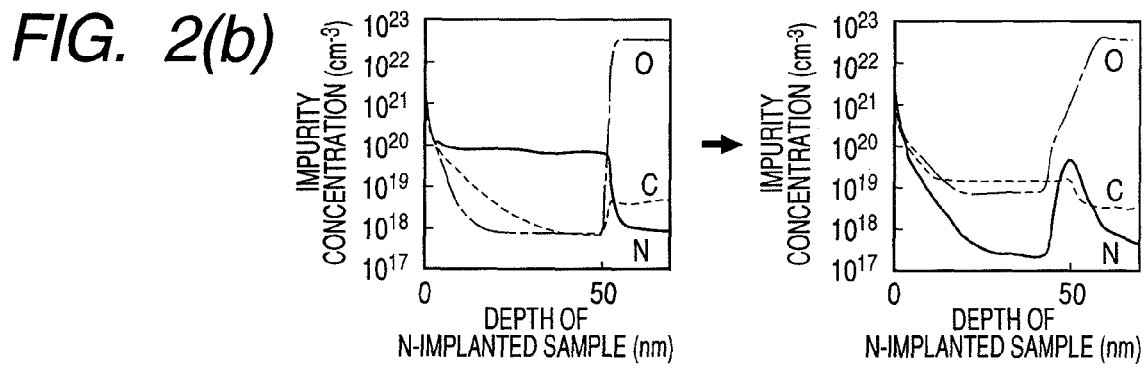
Figure 2C:
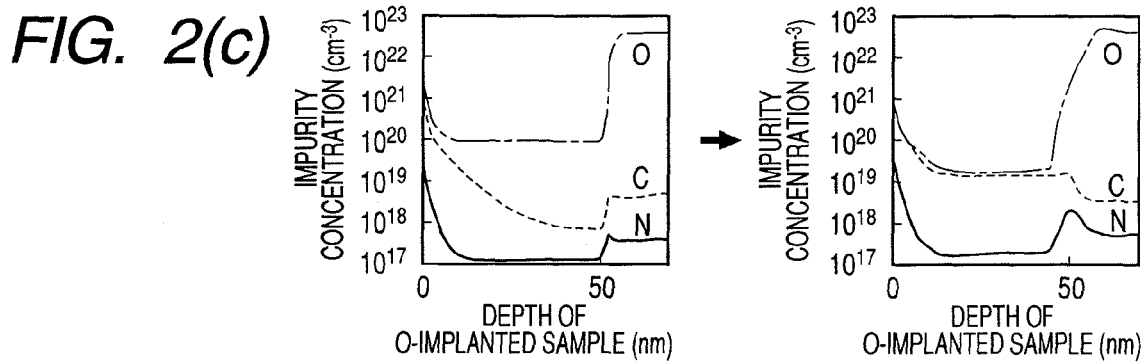
Figure 2D:
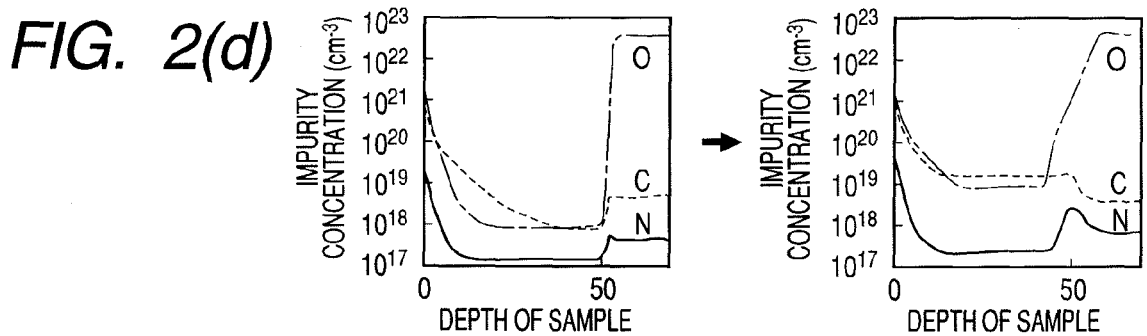
Figure 3:
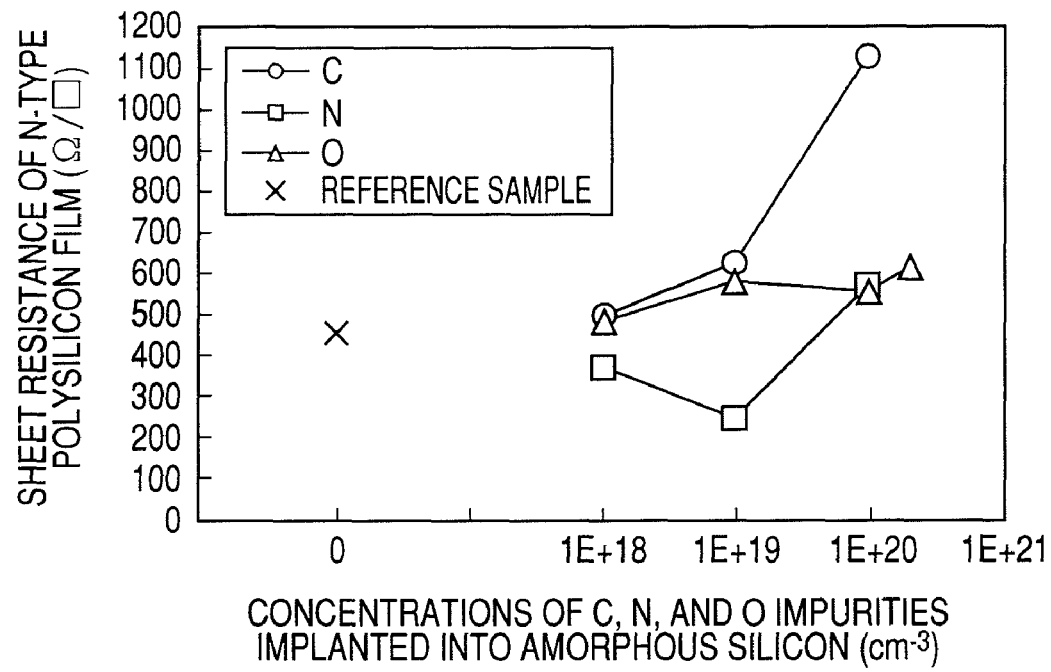
FIG. 3 represents relationships between the sheet resistance of an n-type semiconductor film and the amounts of C, N, and O implanted.
Figure 4:
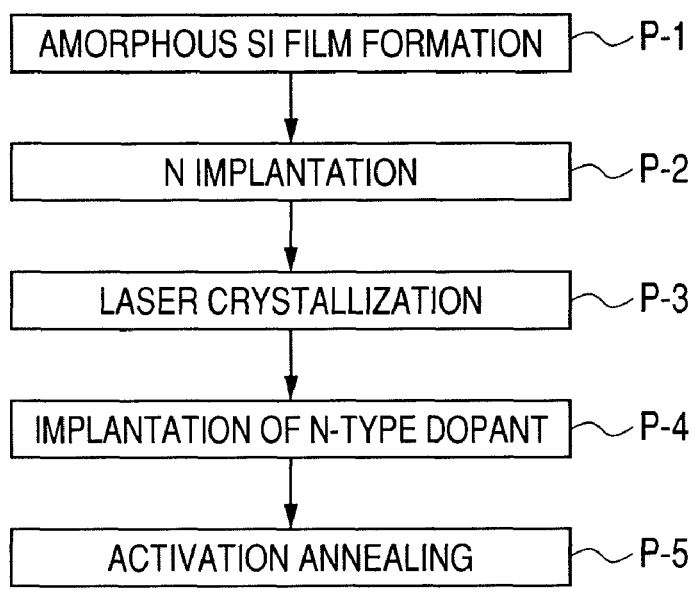
FIG. 4 shows a sequence of processes for manufacturing a low-resistance semiconductor layer to explain a first embodiment of the present invention.

FIG. 4 shows a sequence of processes for manufacturing a low-resistance semiconductor layer to explain a first embodiment of the present invention. FIGS. 5A through 5E show cross-sectional views of the substrate corresponding to the processes in FIG. 4. Using FIGS. 4 and 5, the first embodiment of the present invention is described below. A 140-nm thick silicon nitride (SiN) film and a 100-nm thick silicon oxide (SiO) film are formed as a dielectric undercoat layer UDC on a 0.6-mm thick glass substrate GLS and, on top of the undercoat, a 50-nm thick amorphous silicon film is subsequently formed as a precursor semiconductor film PCF, using the plasma CVD process (P-1: amorphous Si film formation).

The dielectric undercoat layer UDC may consist entirely of the SiO film or the SiN film and, as its thickness, a suitable thickness may be chosen for application. This dielectric undercoat layer UDC does not influence the effect of the method of decreasing the resistance of the film in the present embodiment. The precursor semiconductor film PCF may be an amorphous semiconductor film formed by CVD (Chemical Vapor Deposition), a polycrystalline film produced by irradiating the entire surface of the amorphous semiconductor film with excimer laser, or a polysilicon semiconductor film produced by any other method (e.g., formed by CVD). Alternatively, an amorphous or polycrystalline compound semiconductor consisting primarily of silicon may be used.

In the case of the normal TFT fabrication process, after forming the precursor semiconductor film PCF, hydrogen in the amorphous silicon is reduced by annealing at 400° C., if necessary, and, then, a polysilicon PSI film is formed by laser annealing crystallization. However, for the low-resistance film of the present embodiment, after the PCF is covered by a 30-nm thin protective film POI of an SiO insulating material, N ions are implanted, as shown in FIG. 4 (P-2: N implantation). N ion implantation is performed with energy of 25 keV and by a concentration of $1\times10^{14}$ cm$^{-3}$. After the N implantation, the insulating material is removed by etching.

For crystallization by laser annealing, either the ELA process or the annealing method by means of CW laser may be used to decrease the film resistance effectively. However, the use of CW laser produces a greater effect. CW laser light with a wavelength of 532 nm is shaped into a line beam and the precursor semiconductor film PCF is irradiated with this beam (P-3: laser crystallization).

By moving this line beam in a transverse direction (the direction intersecting the lengthwise axis of the line beam, generally, the direction perpendicular to this axis), polysilicon is crystallized and grown in the laser scan direction, thus producing a planar surface polysilicon film in which the crystal grain size is large and the grain width is uniform. At this time, the beam may be moved or the sample may be moved in an opposite direction to the crystal growing direction. As laser irradiation conditions, the laser beam is set to irradiate a spot that is 5 µm in the scan direction and about 50 µm in the beam width, moving at a scan rate of 300 mm/s. These values are determined by the thickness of the amorphous silicon film, that is, the precursor semiconductor film and other parameters including the output power of the laser light source, the thermal conductivity of the substrate, and the thickness of the dielectric undercoat layer.

The polysilicon semiconductor film PSI produced by the present embodiment grows laterally (crystals grow along the laser scan direction) like a normal CW laser annealing method and, thus, crystal boundaries are primarily formed in parallel with the laser scan direction. The crystal grain size in a region with an area ratio of 60% or more is not less than 0.2 µm wide and 3 µm long. This is not distinguishable from the crystal grain size produced by normal CW laser annealing crystallization without N implantation. Level difference in regard to the surface roughness analyzed by an atomic force microscope (AFM) is 5 nm or less, which is at an equal level as observed in a film produced by the normal method.

After polysilicon crystallization, SiO is deposited by plasma CVD to form a protective film POI for implanting dopant ions. When fabricating a TFT, this SiO layer becomes a gate insulator. P as an n-type dopant is implanted by a concentration of $1\times10^{15}$ cm$^{-2}$ (P-4: implantation of n-type dopant). This is activated by annealing at 500° C. (P-5: activation annealing), thereby the n-type semiconductor film with a low resistance is produced. The sheet resistance of the film measured in the crystal growing direction is 238 Ω/□, as obtained by the present embodiment, which is 40% lower than 454 Ω/□ measured for the reference sample without being implanted with N. Implantation of B as a dopant produces a p-type low-resistance film.

A laser instrument outputting a laser light with a wavelength of 532 nm used in this embodiment is a solid laser device that converts a laser light with a wavelength of 1064 nm generated from an YVO crystal excited by a semiconductor laser into the laser light with a wavelength of 532 by means of an element for wavelength conversion by secondary harmonics generation (SHG). However, other CW lasers may be used; for example; a CW laser outputting a laser light with a wavelength of 408 nm. This reduces thermal damage to the substrate, as the semiconductor film consisting primarily of silicon has a high absorption coefficient. Besides the solid laser, a GaN-based semiconductor laser, a CW laser using gas or the like, and a so-called pseudo CW laser with an oscillation frequency of several tens of MHz or more are available.

The laser instrument may be used in a wide range of ways other than a typical manner of its use described in the first embodiment without departing the essentiality of the present invention. For example, a round shape beam and the like may be used, although the line beam shape of the laser light as used in the present embodiment enables more efficient use of the laser power. Plural laser instruments in parallel may be used instead of a single laser instrument to broaden the crystallized are at a time. A low-resistance polysilicon film can be produced even in such a manner in which the intensity distribution of the pulse light from an excimer laser or the like is modulated in two dimensions on the sample for lateral growth of crystallization.

The above-described embodiment is an example of laser crystallization using the CW laser or laser crystallization in which the crystal growing direction is controlled. However, the present invention is also effective even with the use of the excimer pulse laser in which the growing direction is random. In this case, large area crystallization becomes possible because the excimer laser intensity is high and this is suitable for manufacturing at low cost.

Second Embodiment

While, in the first embodiment, N ions are implanted to introduce N into the amorphous silicon film as the precursor semiconductor film, other methods of N introduction into the film may be possible without departing the technical concept of the present invention. For example, one possible method is such that an impurity gas including N is allowed to flow in the process of forming the amorphous silicon film by the plasma CVD process to expose the film to the atmosphere in which a large amount of N exists, thus leading to the incursion of N into the film.

Polysilicon crystallization may be performed by other methods than laser annealing. One possible method of crystallization is directly depositing polysilicon on the dielectric undercoat layer on top of the glass substrate. However, in this method, it is desirable to deposit polysilicon under the condition that N is accumulated at the interface with the dielectric undercoat layer. For this reason, the impurity gas must be controlled for rapid introduction of N at a high concentration. If such control is practically impossible, it is inevitable that N is introduced into polysilicon film evenly in the depth direction. Even in that event, the effect of decreasing the resistance of the film is obtained to a certain degree.

If an increase in the number of processes should be avoided, giving priority to cost over maximizing the effect of decreasing the resistance of the film, N may be implanted into polysilicon following the crystallization. If N is implanted together with an n-type and p-type dopant, the number of processes does not increase. In this case, however, N is introduced into the film at an even concentration in the depth direction, but the effect to a certain degree can be expected.

Third Embodiment

Figure 6:
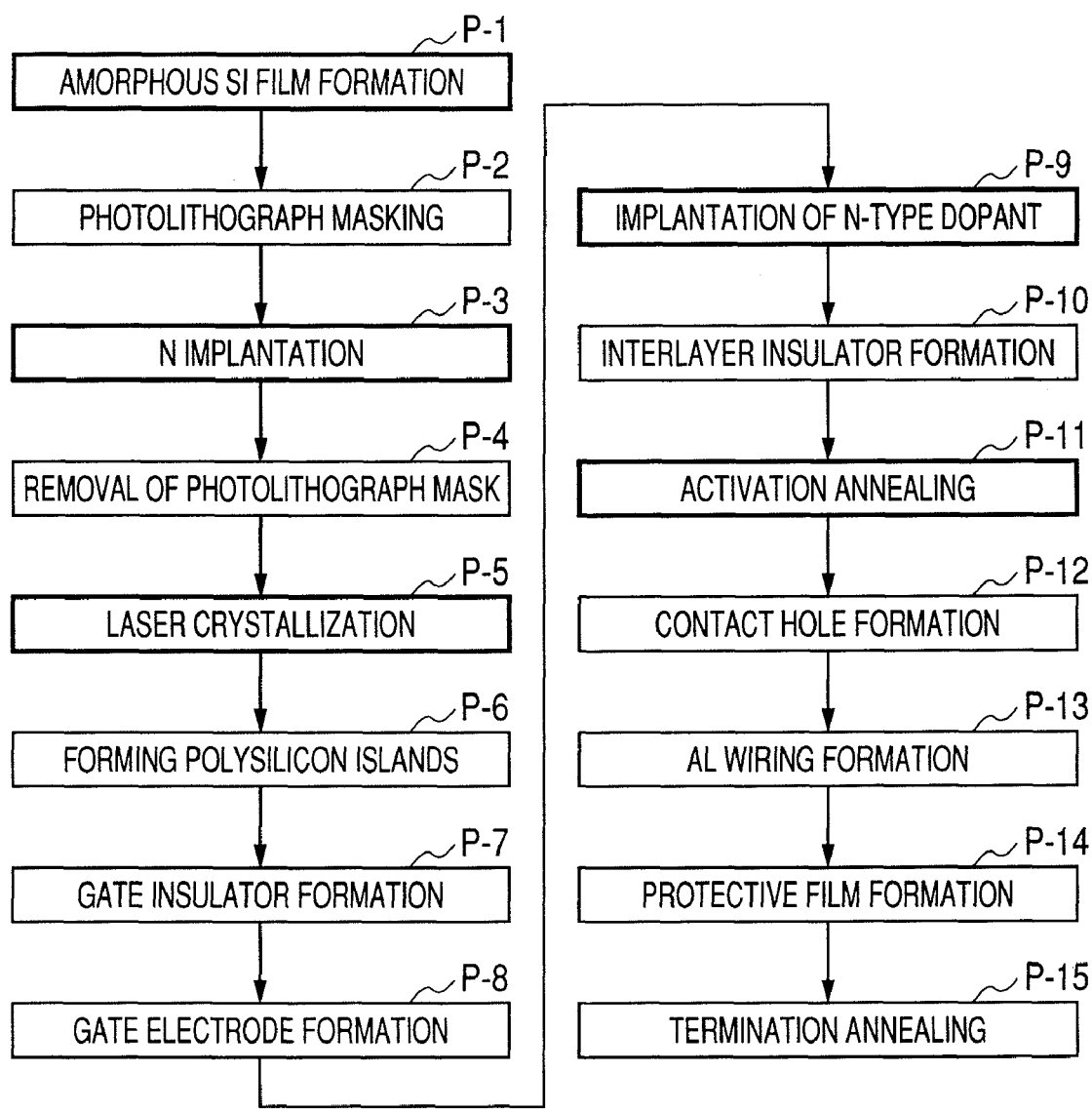
FIG. 6 shows a sequence of processes for manufacturing a thin-film transistor to explain a third embodiment of the present invention.
Figure 7:
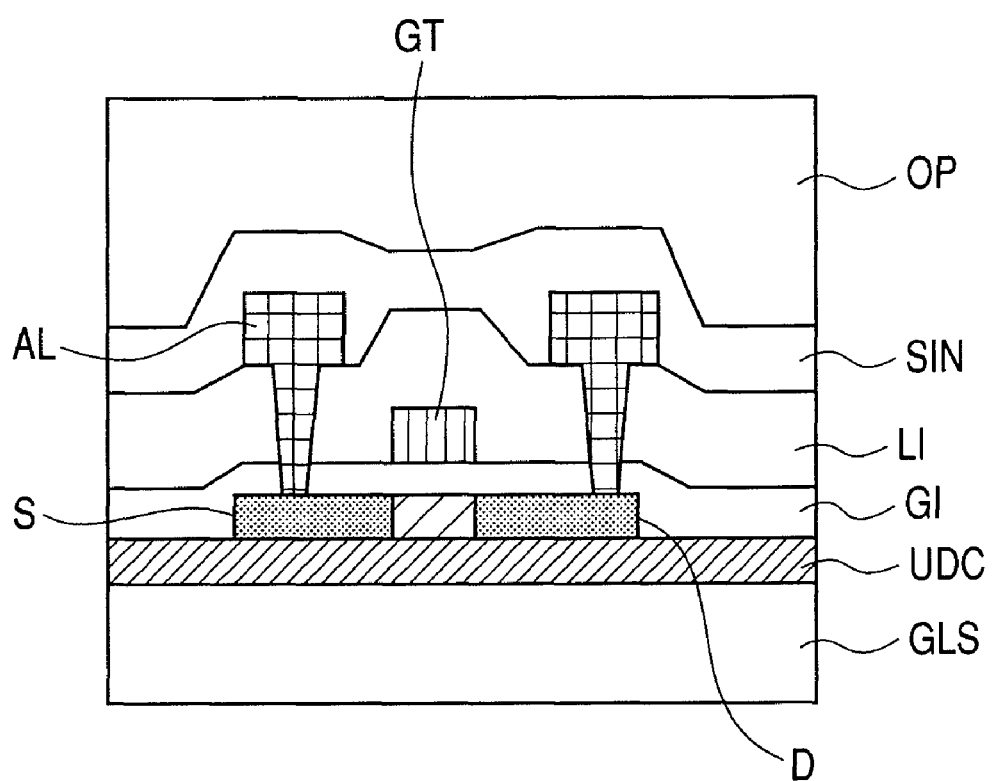
FIG. 7 shows a cross-sectional view of the thin-film transistor.

In the first embodiment, the sequence of the processes for manufacturing, the n-type (or p-type) low-resistance film has been discussed. In a third embodiment, a sequence of processes for manufacturing a TFT using this low-resistance film is discussed. FIG. 6 shows a sequence of processes for manufacturing a TFT to explain the third embodiment of the present invention. FIG. 7 shows a cross-sectional view of the TFT. In the sequence shown in FIG. 6, common processes corresponding to the processes for manufacturing the low-resistance film shown in FIG. 4 are marked with bold frames.

Using FIGS. 6 and 7, the third embodiment is described. As is the case for the first embodiment, on a 0.6-mm thick glass substrate GLS, a 140-nm thick silicon nitride (SiN) film, a 100-nm thick silicon oxide (SiO) film, and a 50-nm thick amorphous silicon film as a precursor semiconductor film PCF are formed in series, using the plasma CVD process (P-1: amorphous Si film formation). After masking the overall surface by 30-nm protective film POI, the surface outside regions where the resistance of the film should be decreased is masked by a photolithography process (hereinafter referred to as photolithography) (P-2: photolithography masking). Next, N is implanted (P-3: N implantation). At least the regions corresponding to a source region S and a drain region D of the TFT must be the openings of the photolithography mask so that N is implanted into these regions.

After removing the photolithography mask and the SiO protective film (P-4: removal of photolithography mask), the precursor semiconductor film is annealed by the CW laser and thus crystallized into the polysilicon film PSI (P-5: laser crystallization).

After forming polysilicon islands by photolithography and dry etching (P-6: forming polysilicon islands), a gate insulator GI is deposited (P-7: gate insulator formation). On top of this, a metal film consisting of molybdenum tungsten (MoW) is further deposited by sputtering and this film is processed into a gate electrode GT by photolithography. At this time, gate wiring is also processed (P-8: gate electrode formation).

Next, after implanting phosphorus (P) or boron (B) impurities into predetermined positions using a photoresist mask (P-9: implantation of n-type dopant), an interlayer insulator LI consisting of SiO is deposited by plasma CVD (P-10: interlayer insulator formation). By annealing at 500° C., the implanted P and B impurities are activated and the source and drain of the TFT is formed (P-11: activation annealing). Contact holes to the source, drain and gate electrode are formed by etching the interlayer insulator LI and the gate insulator GI (P-12: contact hole formation).

Further, a metal film consisting of a laminate of MoW and aluminum (Al) is deposited by sputtering and aluminum wiring Al is formed by means of photolithography (P-13: Al wiring formation). Further, a protective film SIN consisting of SiN is formed by means of plasma CVD (P-14: protective film formation) and termination treatment is performed by annealing at 400° C. (P-15: termination annealing). In the case of the TFT that is used for a liquid crystal pixel, further, after making openings for through holes and terminals in the SiN protective film SIN, a transparent electrode consisting of ITO is deposited by sputtering and processed into a pixel electrode by photolithography. The above is the sequence of the processes for fabricating the TFT in which the low-resistance film of the present invention is used in the source and drain.

While, in the above-described embodiment, the openings are made in the photolithography mask to expose only the regions where the resistance of the film should be decreased, it is possible to implant N throughout the film, omitting this process. In this case, although the N impurities decrease the mobility of the channel portions, the present invention can be adopted according to required TFT specifications and cost.

Although, in the present embodiment, a basic structure of TFT is referred to by way of example, the method is also applicable to an LDD region provided at the gate end, where the impurity concentration should be lower than in the source region and the drain region. In this case, because the applied method increases the mobility without increasing the carrier concentration in the LDD region, it becomes possible to decrease the resistance of the film without posing an electric field concentration problem.

Fourth Embodiment

Figure 8:
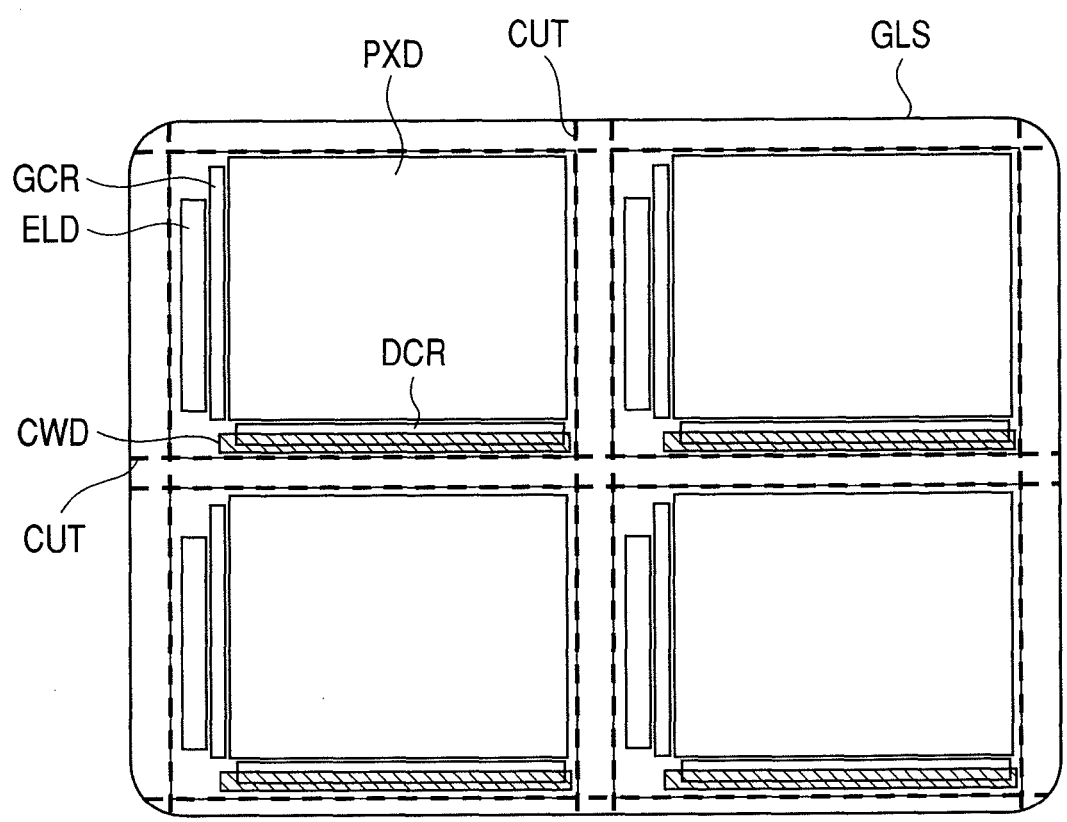
FIG. 8 shows a liquid crystal display device as one object to which the low-resistance film of the present invention is applied.

FIG. 8 shows a liquid crystal display device as one object to which the low-resistance film of the present invention is applied. FIG. 8 shows a plurality of (four) liquid crystal display subunits (exactly, liquid crystal panels constituting the liquid crystal display), wherein cut positions CUT for separation in a subsequent process are marked with dotted bold lines. Each section of the display device includes a pixel area PXD for displaying an image, a circuit area for driving pixel TFTs, and a terminal area ELD where connection terminals are formed.

The circuit area is roughly divided into a gate line driving circuit region GCR which applies scan signals to gate lines and a signal line driving circuit region DCR which supplies display signals to signal lines. In these regions where TFTs are used, a portion of the signal line driving circuit region DCR has the largest need for the TFTs of the present invention. In this portion, since the TFTs constituting a digital signal processing circuit are fabricated, high-speed performance is needed and a high on-current and a low threshold are required. On the other hand, there are TFTs for which a low leak current and high voltage tolerance are required, Like the TFTs as pixel switching elements.

To fabricate an image display device, the TFTs of different specifications, as described above, must be formed together on a same glass substrate. To do so, one manner is selectively using either ELA process or the CW laser annealing process as the polysilicon crystallization method for each region (area). It is also possible to select which region (area) to which the low-resistance film of the present invention should be applied. As a typical embodiment, the CW laser annealing process would have a low throughput and would be unsuitable for large area crystallization in terms of cost, because its laser intensity is low.

Therefore, the present invention should be applied to a region (area) where highest performance TFTs are needed. Specifically, such region is a region CWD crystallized by the CW laser annealing process only in a portion of the signal line driving circuit region DCR where high-speed performance is required. It is generally reasonable that the remaining pixel area PXD and gate line driving circuit region GCR should be crystallized by the ELA process without applying the present invention. However, the described TFT manufacturing method may be selected, taking the cost of the device as a whole into consideration.

Figure 9:
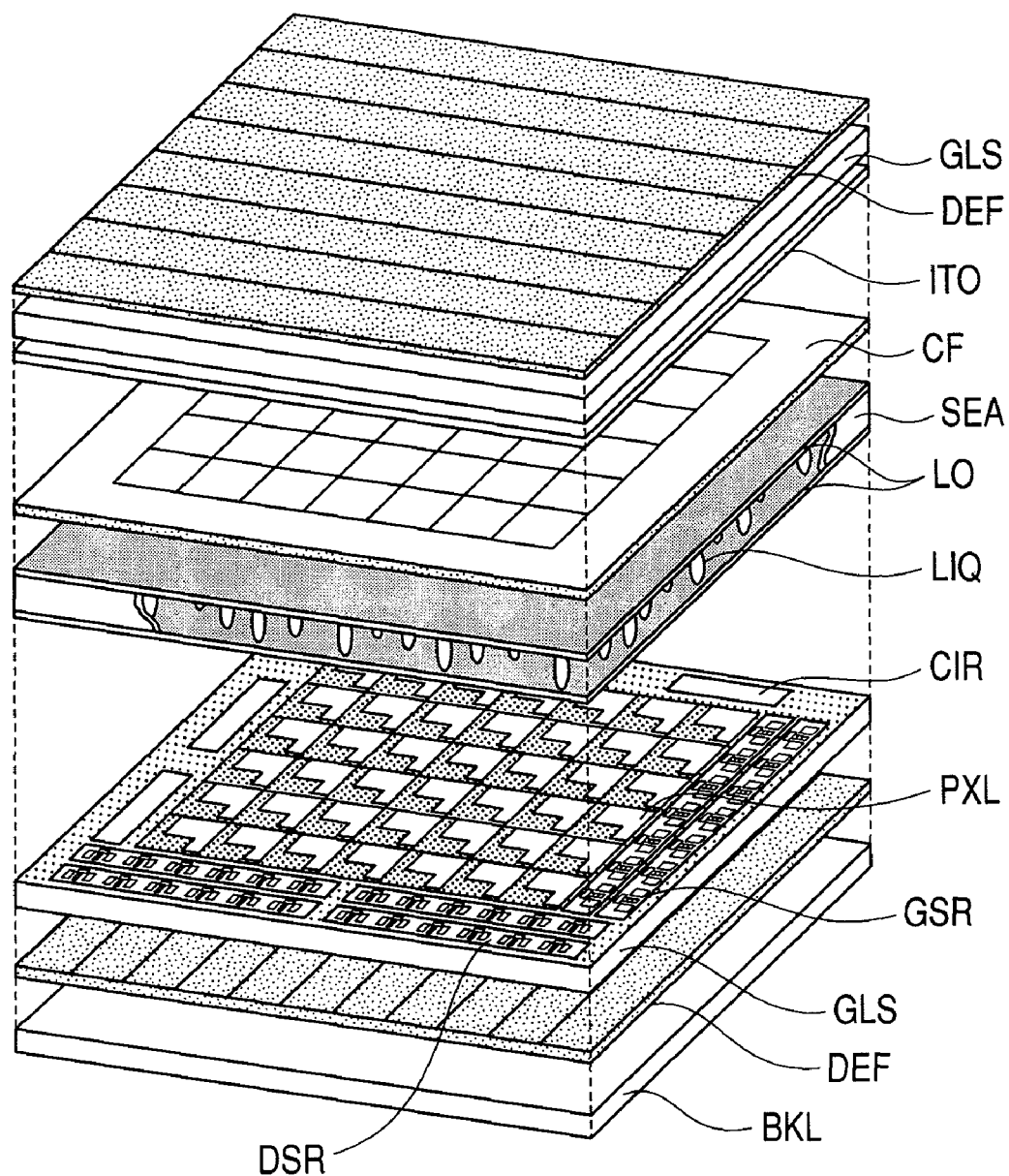
FIG. 9 shows a projected perspective view of a liquid crystal display device to explain its configuration as an example of an image display device according to the present invention.

FIG. 9 shows a projected perspective view of a liquid crystal display device to explain its configuration as an example of an image display device according to the present invention. On a TFT side glass substrate GLS, a plurality of pixel electrodes PXL arranged in a matrix, circuits DSR and GSR which input display signals to the pixel electrodes, and a set of circuits CIR required to display an image are formed. The top surface of this glass substrate GLS is coated with an orientation film LO by a printing process. After drying this film, orientation processing is performed.

On the other hand, to the inner surface of a color filter side glass substrate GLS, an opposing electrode ITO, a color filter CF, and an opposing substrate coated with an orientation film LO are bonded. After the opposing electrode is bonded, the space between both orientation films LO facing with each other is filled with liquid crystal by vacuum injection and its peripheries are sealed by a sealant SEA to enclose the liquid crystal.

Subsequently, deflecting plates DEF are bonded to the top surface and the under surface, respectively, and a backlight BKL is installed. Then, the liquid crystal display device (liquid crystal panel) is completed. Connections in the terminal area are attached to this liquid crystal panel and each liquid crystal panel is cut out by cutting into individual substrates and separation into individual liquid crystal panels (substrate cutting). This liquid crystal panel constitutes a transmissive liquid crystal device. In an alternative manner, after liquid crystal is dropped onto the TFT substrate and this substrate and the opposing substrate are bonded together.

Although a liquid crystal display device using a color filter substrate is described below by way of example, the low-resistance film of the present invention can be applied in a similar manner to a liquid crystal display device in which a color filter is formed over the active matrix substrate.

In the above liquid crystal panel, it becomes possible to build a set of high-speed circuits within the same glass substrate, though these circuits have so far assembled in an LSI chip externally attached to the image display area mounted on the glass substrate. Thereby, the LSI chip cost can be cut and the panel's peripheral area outside the pixel area can be reduced. Circuit customization which has heretofore been carried out in the phase of LSI chip design and manufacture can be performed in the panel manufacturing process.

While, in the present embodiment, the transmissive liquid crystal display device has been discussed as an example, the present invention can also be applied in a similar manner to a semi-transmissive liquid crystal display device in which reflective or partially reflective pixels are formed. An organic EL display device can be manufactured in the same way as the liquid crystal display device of the present embodiment.

Figure 10:
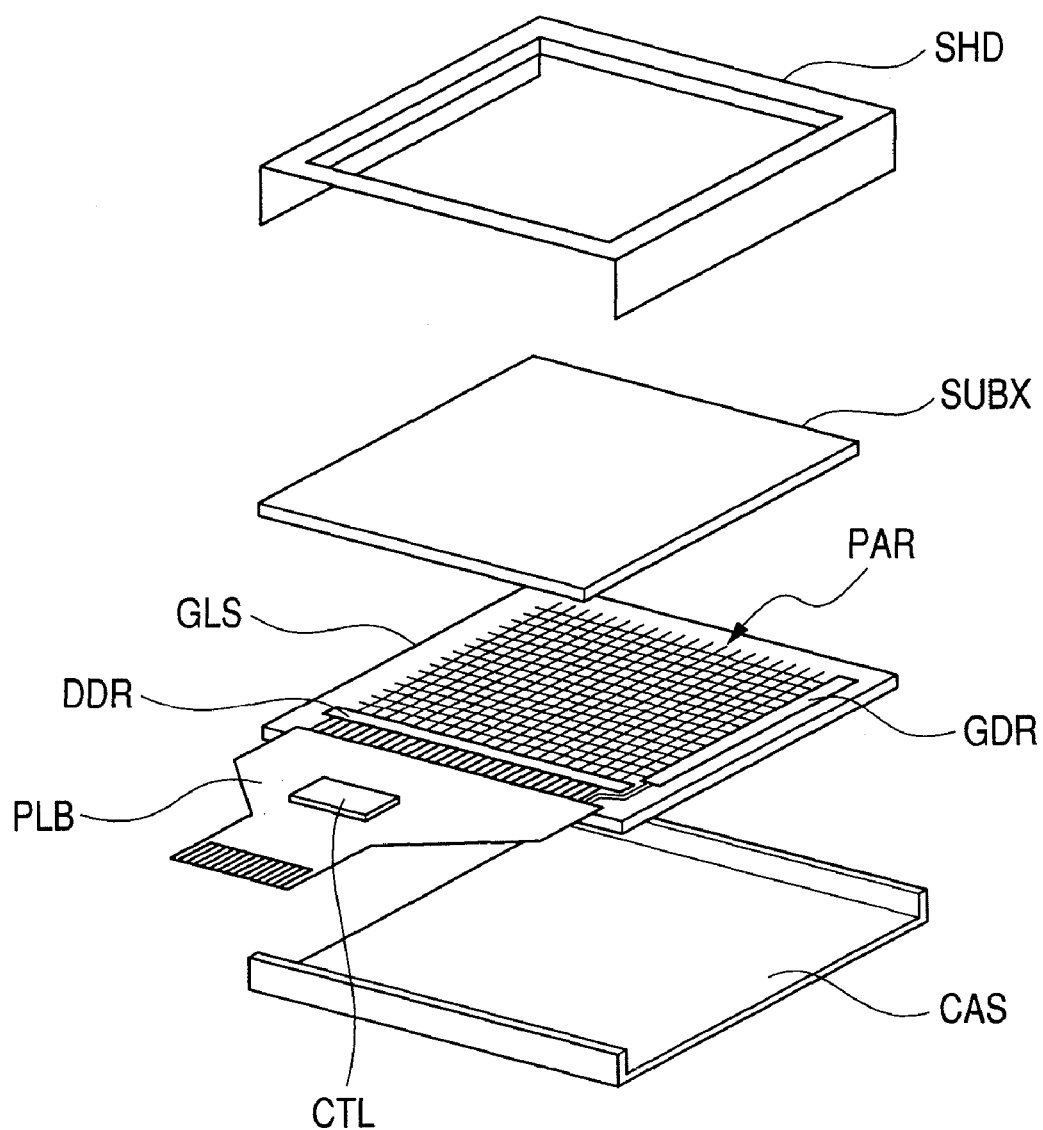
FIG. 10 shows a projected perspective view of an organic EL display device to explain its configuration as a second example of an image display device of the present invention.
Figure 11:
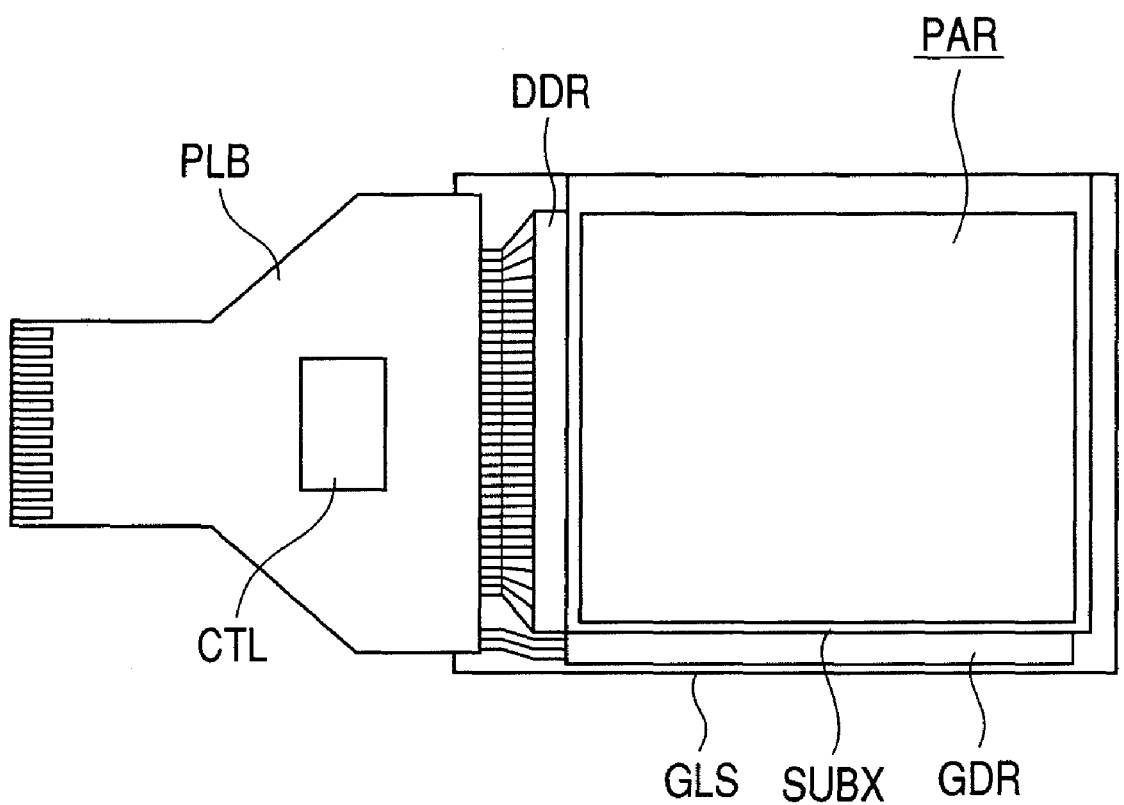
FIG. 11 shows a plan view of the organic EL display device into which its components shown in FIG. 10 have been assembled.

FIG. 10 shows a projected perspective view of an organic EL display device to explain its configuration as a second example of an image display device of the present invention. FIG. 11 shows a plan view of the organic EL display device into which its components shown in FIG. 10 have been assembled. Organic EL elements are formed on the pixel electrodes comprised in the above-mentioned active matrix substrate GLS. The organic EL elements are formed of a laminate of a hole transport layer, light emitting layer, electron transport layer, and cathode metal layer deposited in series on the pixel electrode surface. Sealants are placed around the pixel area PAR where this laminate layer was formed on the active matrix substrate GLS and the laminate is sealed with a sealing substrate SUB or a sealing can.

In this organic EL display device, signals for display from an external signal source are supplied to a drain driving circuit region DDR, a gate driving circuit GDR, and other peripheral circuits CTL via a printed-circuit board (PLB). All components are packaged between a shield frame SHD as the upper case and the lower case CAS, thus fabricating the organic EL display device. In regard to driving the elements in the active matrix for the organic EL display device, since the organic EL elements are driven by current to emit light, it is essential to adopt high-performance TFTs for pixels to provide good-quality images.

Also, the circuits formed in the drive circuit area are essential for high speed and high resolution. The active matrix substrate to which the present invention is applied has high performance fulfilling such requirements. The organic EL display device using that active matrix substrate is one of the display devices that maximize the features of the present embodiment.

While how to apply the present invention to the semiconductor devices for image display has been discussed in the fourth embodiment, examples of products in which the advantageous effect of the present invention is significantly exhibited are the image display unit of mini-TVs, mobile phones, personal terminal assistants (PDAs), and the like, the viewfinder of motion-picture projector CAM, other digital still cameras, projectors, in-vehicle navigation systems, etc.

The present invention is not restricted to the above-described image display devices and not limited to the constitutions described in attached claims and the constitutions described in the embodiments and may be changed in various forms without departing the technical concept and idea of the present invention. In other words, the present invention is applicable to various types of semiconductor devices, not limited to semiconductor devices for image display. The present invention can also be applied to forming a semiconductor device in which circuits are simply formed. If the present invention is applied to simply form circuits on a substrate, all circuit regions can be formed with a semiconductor film crystallized by directly irradiating the amorphous silicon film with a CW laser light and the irradiation with a pulse excimer laser light can be dispensed with.

What is claimed is:

1. A method for manufacturing an image display device which includes a substrate, a dielectric undercoat layer which covers the substrate, and thin-film transistors which are formed in a semiconductor layer consisting primarily of silicon and having crystal properties, formed on said dielectric undercoat layer, said method comprising:
   accumulating nitrogen in said semiconductor layer so that the nitrogen concentration becomes high near an interface with said dielectric undercoat layer;
   implanting n-type or p-type dopant ions into said semiconductor layer; and
   making an n-type or p-type semiconductor layer with a low resistance by activation annealing,
   wherein said semiconductor layer with a low resistance is configured to be used in parts of said thin-film transistors.

2. The method for manufacturing an image display device according to claim 1, wherein said nitrogen is accumulated at the interface between said semiconductor layer and said dielectric undercoat layer through melting and re-crystallization by laser annealing.

3. The method for manufacturing an image display device according to claim 2, wherein, by scanning with a continuous wave laser light or a pseudo continuous wave laser light, said laser annealing causes a semiconductor crystal layer consisting primarily of silicon to grow in an irradiated zone by the scanning with the continuous wave laser light or the pseudo-continuous wave laser light.

4. The method for manufacturing an image display device according to claim 2, wherein at least a part of the nitrogen accumulated at the interface between said semiconductor layer consisting primarily of silicon and said dielectric undercoat layer is nitrogen ions implanted before the laser annealing.

5. The method for manufacturing an image display device according to claim 2, wherein the melting and re-crystallization by said laser annealing are performed at least twice.

6. The method for manufacturing an image display device according to claim 1, wherein the nitrogen accumulated at the interface between said semiconductor layer consisting primarily of silicon and said dielectric undercoat layer has a peak concentration larger than $5 \times 10^{18}$ cm$^{-3}$ in its concentration profile along film depth of said semiconductor layer.

7. The method for manufacturing an image display device according to claim 1, wherein, in said semiconductor layer consisting primarily of silicon, concentrations of carbon, nitrogen, and oxygen impurities, in a lowest concentration portion, are regulated to meet the following conditions: carbon $\leqq 3 \times 10^{19}$ cm$^{-3}$, nitrogen $\leqq 5 \times 10^{17}$ cm$^{-3}$, and oxygen $\leqq 3 \times 10^{19}$ cm$^{-3}$; preferably, carbon $\leqq 2 \times 10^{19}$ cm$^{-3}$, nitrogen $<3 \times 10^{17}$ cm$^{-3}$, and oxygen $\leqq 7 \times 10^{18}$ cm$^{-3}$.

8. The method for manufacturing an image display device according to claim 1, wherein said semiconductor layer is used to form a part of each source and drain of each of said thin-film transistors.

9. The method for manufacturing an image display device according to claim 8, wherein nitrogen ions implanted before laser annealing for crystallization are accumulated at the interface with said dielectric undercoat layer in a region corresponding to at least a part of each source and drain of said thin-film transistors and a channel region between the source region and the drain region is masked so that nitrogen incursion is prevented before implanting nitrogen into said semiconductor layer consisting primarily of silicon, including said part of the source region and the drain region.

10. The method for manufacturing an image display device according to claim 9, wherein the concentration of nitrogen accumulated at the interface with the undercoat in at least a part of the source region and the drain region of each said thin-film transistor is higher than the concentration of nitrogen accumulated in the channel region.

11. The method for manufacturing an image display device according to claim 1, wherein said semiconductor layer is used to form at least a part of a first region located between a channel and a source/drain of each said thin-film transistor, wherein a dopant concentration in said region is lower than that in the source/drain.

12. The method for manufacturing an image display device according to claim 11, wherein nitrogen ions implanted before laser annealing for crystallization are accumulated at the interface with said dielectric undercoat layer in at least the part of the first region where the dopant concentration is lower than that in the source/drain between the channel and the source/drain of each said thin-film transistors, and wherein the channel is masked so that nitrogen incursion is prevented before implanting nitrogen into said semiconductor layer consisting primarily of silicon, including said part of the region with said lower dopant concentration.

13. The method for manufacturing an image display device according to claim 12, wherein the concentration of nitrogen accumulated at the interface with the undercoat in at least the part of the first region where the dopant concentration is lower than that in the source/drain between the channel and the source/drain of each said thin-film transistors is higher than the concentration of nitrogen accumulated in the channel.

* * * * *